United States Patent
Lee et al.

(10) Patent No.: US 11,328,407 B2
(45) Date of Patent: *May 10, 2022

(54) METHOD FOR INSPECTING MOUNTING STATE OF COMPONENT, PRINTED CIRCUIT BOARD INSPECTION APPARATUS, AND COMPUTER READABLE RECORDING MEDIUM

(71) Applicant: KOH YOUNG TECHNOLOGY INC., Seoul (KR)

(72) Inventors: Se Rin Lee, San Diego, CA (US); Jin Man Kang, San Diego, CA (US); Joong Ki Jeong, Gwangmyeong-si (KR); Jung Ho Son, Seoul (KR); Min Cheol Yoon, Seoul (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 29 days.

This patent is subject to a terminal disclaimer.

(21) Appl. No.: 16/976,006

(22) PCT Filed: Feb. 26, 2019

(86) PCT No.: PCT/KR2019/002330
§ 371 (c)(1),
(2) Date: Aug. 26, 2020

(87) PCT Pub. No.: WO2019/164382
PCT Pub. Date: Aug. 29, 2019

(65) Prior Publication Data
US 2021/0042910 A1    Feb. 11, 2021

Related U.S. Application Data

(60) Provisional application No. 62/635,022, filed on Feb. 26, 2018.

(51) Int. Cl.
*G06T 7/00* (2017.01)
*G06T 7/521* (2017.01)
(Continued)

(52) U.S. Cl.
CPC ............ *G06T 7/0004* (2013.01); *G01B 11/22* (2013.01); *G01B 11/24* (2013.01); *G01N 21/956* (2013.01);
(Continued)

(58) Field of Classification Search
CPC ....... G06T 7/0004; G06T 7/521; G06T 7/586; G06T 2207/10028; G06T 2207/10152;
(Continued)

(56) References Cited

U.S. PATENT DOCUMENTS

2010/0091302 A1    4/2010  Kim
2010/0295941 A1    11/2010 Jeong et al.
(Continued)

FOREIGN PATENT DOCUMENTS

CN    101256067    9/2008
CN    101943572    1/2011
(Continued)

OTHER PUBLICATIONS

Riegler et al. "Depth Restoration via Joint Training of a Global Regression Model and CNNs", pp. 58.1-58.12, 2015 . This document is from the IDS dated Apr. 23, 2021 and is therefore not provided (Year: 2015).*
(Continued)

*Primary Examiner* — Richard A Hansell, Jr.
(74) *Attorney, Agent, or Firm* — Kile Park Reed & Houtteman PLLC

(57) ABSTRACT

A printed circuit board inspection apparatus can inspect the mounting state of a component by generating depth information on the component mounted on a printed circuit board
(Continued)

by using a pattern of light reflected from the component and received by an image sensor, inputting the generated depth information into a machine-learning-based model, obtaining depth information with reduced noise from the machine-learning-based model, and using depth information with reduced noise.

16 Claims, 8 Drawing Sheets

(51) Int. Cl.
| | |
|---|---|
| G01B 11/22 | (2006.01) |
| G01N 21/956 | (2006.01) |
| H04N 5/225 | (2006.01) |
| G06T 7/586 | (2017.01) |
| G01B 11/24 | (2006.01) |
| G06N 3/08 | (2006.01) |
| H04N 5/247 | (2006.01) |
| H05K 13/08 | (2006.01) |

(52) U.S. Cl.
CPC ............... *G06N 3/08* (2013.01); *G06T 7/521* (2017.01); *G06T 7/586* (2017.01); *H04N 5/2256* (2013.01); *H04N 5/247* (2013.01); *G01N 2021/95638* (2013.01); *G06T 2207/10028* (2013.01); *G06T 2207/10152* (2013.01); *G06T 2207/20081* (2013.01); *G06T 2207/20084* (2013.01); *G06T 2207/30141* (2013.01); *H05K 13/081* (2018.08)

(58) Field of Classification Search
CPC . G06T 2207/20081; G06T 2207/20084; G06T 2207/30141; G06T 2207/10024; G06T 5/002; G01B 11/22; G01B 11/24; G01B 11/2509; G01N 21/956; G01N 2021/95638; G01N 21/8851; G01N 21/95684; G01N 2021/8887; G01N 21/8806; G06N 3/08; G06N 3/0454; G06N 3/0472; G06N 20/00; H04N 5/2256; H04N 5/247; H05K 13/081; H05K 13/0817; H05K 13/0815; H05K 13/08; H05K 2203/16

See application file for complete search history.

(56) References Cited

U.S. PATENT DOCUMENTS

| | | | |
|---|---|---|---|
| 2010/0302364 A1 | 12/2010 | Kim et al. | |
| 2011/0002527 A1 | 1/2011 | Jeong et al. | |
| 2011/0002529 A1* | 1/2011 | Jeong .................... | G06T 7/001 |
| | | | 382/147 |
| 2011/0191050 A1 | 8/2011 | Jeong | |
| 2012/0127486 A1 | 5/2012 | Kim et al. | |
| 2013/0077849 A1 | 3/2013 | Jeong et al. | |
| 2013/0156297 A1 | 6/2013 | Shotton et al. | |
| 2013/0279655 A1 | 10/2013 | Ookawa | |
| 2013/0294679 A1 | 11/2013 | Jeong et al. | |
| 2014/0198185 A1* | 7/2014 | Haugen .............. | G01B 11/2513 |
| | | | 348/47 |
| 2014/0219542 A1* | 8/2014 | Lee .................... | H05K 13/0815 |
| | | | 382/147 |
| 2015/0124081 A1* | 5/2015 | Jeong ................. | G01B 11/2513 |
| | | | 348/135 |
| 2016/0321523 A1* | 11/2016 | Sen ........................ | G06N 3/084 |
| 2017/0177997 A1 | 6/2017 | Karlinsky et al. | |
| 2017/0363548 A1 | 12/2017 | Jeong | |
| 2018/0296281 A1* | 10/2018 | Yeung ..................... | G06T 7/174 |
| 2019/0094151 A1 | 3/2019 | Jeon et al. | |

FOREIGN PATENT DOCUMENTS

| | | |
|---|---|---|
| CN | 102538680 | 7/2012 |
| CN | 103376269 | 10/2013 |
| CN | 103995003 | 8/2014 |
| CN | 104169679 | 11/2014 |
| CN | 107003255 | 8/2017 |
| CN | 107110789 | 8/2017 |
| EP | 2 654 393 | 10/2013 |
| JP | 9-89797 | 4/1997 |
| KR | 2002-0046636 | 6/2002 |
| KR | 10-2010-0041022 | 4/2010 |
| KR | 10-2011-0088967 | 8/2011 |
| KR | 10-1078781 | 11/2011 |
| KR | 10-1311215 | 9/2013 |
| KR | 10-2015-0022158 | 3/2015 |
| KR | 10-1684244 | 12/2016 |
| KR | 10-1721965 | 3/2017 |

OTHER PUBLICATIONS

Gernot Riegler et al. "Depth Restoration via Joint Training of a Global Regression Model and CNNs", Joint Training of a GRM and CNNS; 2015, pp. 58.1-58-12.
Kai Berger et al. "A State of the Art Repod on Kinect Sensor Setups in Computer Vision", Time-of-Flight and Depth Imaging, 2013, pp. 257-272, LNCS 8200.
Chinese Office Action, with English translation, corresponding to Chinese Application No. or Publication No. 201980015619.0, dated Feb. 26, 2021.
Extended European Search Report, corresponding to European Application No./Patent No. 19756511.2, dated Mar. 25, 2021.
International Search Report, with English translation, corresponding to International Application No. PCT/KR2019/002328, dated Jun. 10, 2019.
International Search Report, with English translation, for International Application No. PCT/KR2019/002330, dated Jun. 7, 2019.
Written Opinion, with English translation, corresponding to International Application No. PCT/KR2019/002328, dated Jun. 10, 2019.
Written Opinion, with English translation, corresponding to International Application No. PCT/KR2019/002330, dated Jun. 7, 2019.
Extended European Search Report, corresponding to European Application No./Patent No. 19756876.9, dated Apr. 14, 2021.
U.S. Office Action for U.S. Appl. No. 16/976,008, dated Aug. 26, 2021.
Korean Office Action with English translation for Korean Application No. 10-2020-7024788 dated Oct. 27, 2021.
Korean Office Action with English translation for Korean Application No. 10-2020-7024783 dated Dec. 26, 2021.

* cited by examiner

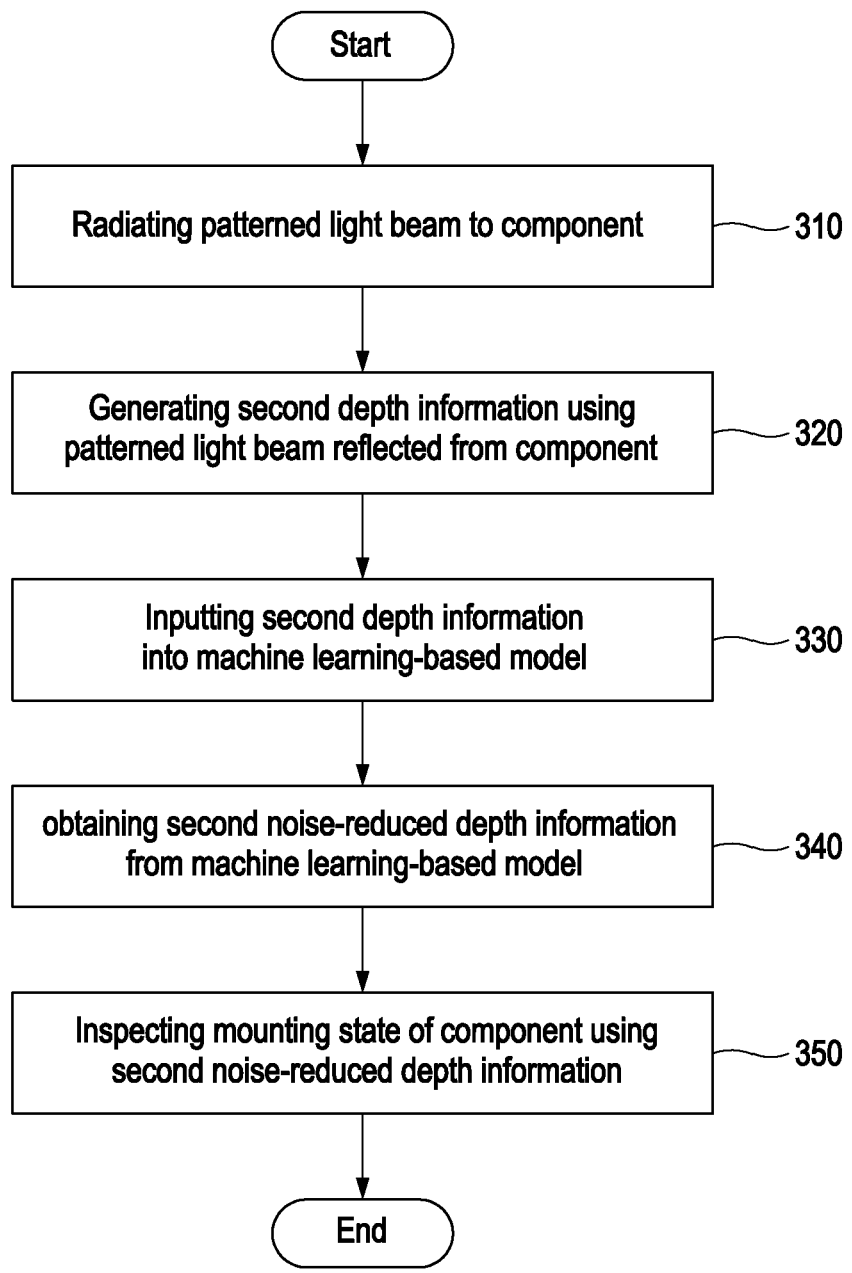

FIG. 8B
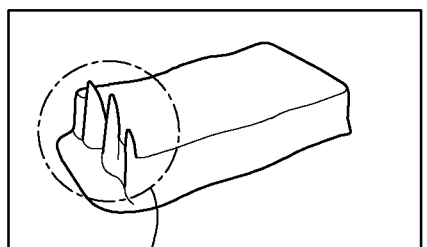
820
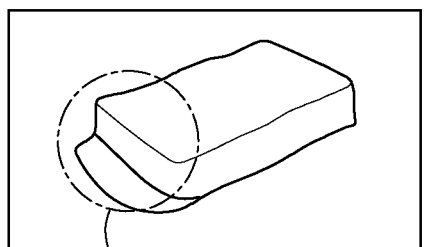
821
FIG. 8C
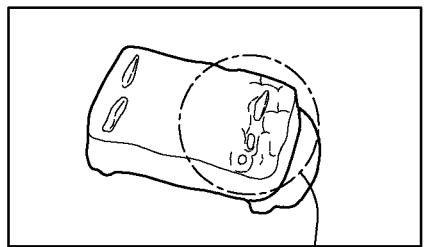
830
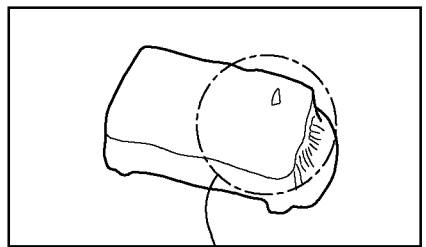
831

METHOD FOR INSPECTING MOUNTING STATE OF COMPONENT, PRINTED CIRCUIT BOARD INSPECTION APPARATUS, AND COMPUTER READABLE RECORDING MEDIUM

TECHNICAL FIELD

The present disclosure relates to a method for inspecting a mounting state of a component, a printed circuit board inspection apparatus, and a computer-readable recording medium.

BACKGROUND

In general, in a manufacturing process using surface-mount technology (SMT) on a printed circuit board, a screen printer prints solder paste on the printed circuit board, and a mounter mounts components on the printed circuit board printed with the solder paste.

In addition, an automated optical inspection (AOI) device is used to inspect the mounting state of the components mounted on the printed circuit board. The AOI device inspects whether the components are normally mounted on the printed circuit board without displacement, lifting, or tilting by using a captured image of the printed circuit board.

On the other hand, in a process in which the AOI device generates an image for the printed circuit board, noise may occur in multiple reflections of light irradiated on the printed circuit board or in the process of processing received light by an image sensor. That is, optical noise and signal noise may variously occur, and if the noise occurring in this manner is not reduced, the quality of the captured image of the printed circuit board generated by the AOI device may deteriorate. When the quality of the captured image of the printed circuit board deteriorates, inspection of the mounting state of the components mounted on the printed circuit board using the captured image of the printed circuit board may not be accurately performed.

SUMMARY

The present disclosure may provide a printed circuit board inspection apparatus that inspects a mounting state of a component by using depth information with reduced noise on the component obtained based on depth information on the component.

The present disclosure may provide a computer-readable recording medium that records a program including executable instructions for inspecting a mounting state of a component by using depth information with reduced noise on the component obtained based on depth information on the component.

The present disclosure may provide a method of inspecting a mounting state of a component by using depth information with reduced noise obtained based on depth information on the component.

According to one embodiment of the present disclosure, a printed circuit board inspection apparatus may inspect a mounting state of a component mounted on a printed circuit board, and the printed circuit board inspection apparatus may include: a plurality of first light sources configured to irradiate the component with a pattern of light; an image sensor configured to receive a pattern of light reflected from the component; a memory configured to store a machine-learning-based, wherein when first depth information on a first object generated using a pattern of light reflected from the first object among patterns of light irradiated from a plurality of second light sources is input into the machine-learning-based model, the machine-learning-based model outputs the first depth information with reduced noise; and a processor, wherein the processor generates second depth information on the component by using the pattern of light reflected from the component and received by the image sensor, inputs the second depth information into the machine-learning-based model, obtains the second depth information with reduced noise from the machine-learning-based model, and inspects the mounting state of the component by using the second depth information with reduced noise.

In one embodiment, the machine-learning-based model may be trained to output third depth information with reduced noise by using the third depth information on a second object generated using a pattern of light reflected from the second object among the patterns of light irradiated from the plurality of second light sources and fourth depth information on the second object generated using a pattern of light reflected from the second object among patterns of light irradiated from a plurality of third light sources, and may output the first depth information with reduced noise when the first depth information is input based on a training result.

In one embodiment, the number of the plurality of second light sources may be the same as the number of the plurality of first light sources, and the number of the plurality of third light sources may be larger than the number of the plurality of first light sources.

In one embodiment, the machine-learning-based model may include a convolutional neural network (CNN) or a generative adversarial network (GAN).

In one embodiment, the processor may generate a three-dimensional image of the second component by using the second depth information with reduced noise, and may inspect the mounting state of the component by using the three-dimensional image of the second component.

In one embodiment, when visibility information on the first object is further input into the machine-learning-based model, the machine-learning-based model may output the first depth information with reduced noise by using the visibility information.

According to one embodiment, the machine-learning-based model may be trained to output third depth information with reduced noise using third depth information on a second object, which is generated using a pattern of light reflected from the second object among the pattern of light radiated from the plurality of second light sources, visibility information on the second object, which is generated using the pattern of light reflected from the second object among the patterns of light radiated from the plurality of second light sources, and fourth depth information on the second object, which is generated using a pattern of light reflected from the second object among patterns of light radiated from a plurality of third light sources, and may output the first depth information with reduced noise based on a training result when the first depth information and visibility information on the component are input.

In one embodiment, the processor may generate visibility information on the component by using the pattern of light reflected from the component and received by the image sensor, and may further input the visibility information on the component into the machine-learning-based model.

According to one embodiment of the present disclosure, a printed circuit board inspection apparatus for inspecting a mounting state of a component mounted on a printed circuit board may include: a plurality of first light sources to radiate a component with a pattern of light; an image sensor to receive the pattern of light reflected from the component; a memory to store a machine-learning-based model, wherein, wherein when a plurality of pieces of depth information on a first object, which is generated using a pattern of light reflected from the first object among patterns of light emitted from a plurality of second light sources, is input into the machine-learning-based model, the machine-learning-based model generates first depth information and outputs the first depth information with reduced noise; and a processor, wherein the processor may generate a plurality of pieces of depth information on the component using the pattern of light which is reflected from the component and is received by the image sensor, may input the plurality of pieces of depth information on the component to the machine-learning-based model, may obtain second depth information with reduced noise from the machine-learning-based model, in which second depth information is generated by the machine-learning-based model based on the plurality of pieces of depth information on the component, and may inspect the mounting state of the component using the second depth information with reduced noise.

According to one embodiment, the machine-learning-based model may be trained to generate and output third depth information with reduced noise using third depth information, which is generated using a plurality of pieces of depth information on the second object generated using a pattern of light reflected from the second object among the patterns of light emitted from the plurality of second light sources, and fourth depth information on the second object, wherein the machine-learning-based model is generated using a pattern of light reflected from the second object among patterns of light radiated from a plurality of third light sources, and wherein the machine-learning-based model generates the first depth information and outputs the first depth information with reduced noise based on a training result when the plurality of pieces of depth information on the first object is input.

According to one embodiment, the plurality of second light sources may be the same in number as the plurality of first light sources, and the plurality of third light sources may be greater in number than the plurality of first light sources.

According to one embodiment of the present disclosure, a non-transitory computer-readable recording medium may record a program to be performed on a computer, wherein the program includes executable instructions that causes, when executed by a processor, the processor to perform operations of: controlling a plurality of first light sources to irradiate a component mounted on a printed circuit board with a pattern of light; generating first depth information on the component by using the pattern of light reflected from the component and received by an image sensor; inputting the first depth information into a machine-learning-based model; obtaining first depth information with reduced noise on the component from the machine-learning-based model; and inspecting the mounting state of the component by using the first depth information with reduced noise on the component, and wherein, when first depth information on the first object generated using a pattern of light reflected from the first object among patterns of light irradiated from a plurality of second light sources is input, the machine-learning-based model outputs the first depth information with reduced noise.

In one embodiment, the machine-learning-based model may be trained to output third depth information with reduced noise by using the third depth information on the second object generated using the pattern of light reflected from a second object among the patterns of light irradiated from the plurality of second light sources and fourth depth information on the second object generated using a pattern of light reflected from the second object among patterns of light irradiated from a plurality of third light sources, and may output the first depth information with reduced noise when the first depth information is input based on a training result.

In one embodiment, in the machine-learning-based model, the number of the plurality of second light sources may be the same as the number of the plurality of first light sources, and the number of the plurality of third light sources may be larger than the number of the plurality of first light sources.

In one embodiment, the machine-learning-based model may include a convolutional neural network (CNN) or a generative adversarial network (GAN).

In one embodiment, the executable instructions may cause the processor to further perform operations of: generating a three-dimensional image of a second component by using second depth information with reduced noise; and inspecting the mounting state of the component by using the three-dimensional image of the second component.

In one embodiment, when visibility information on the first object is further input, the machine-learning-based model may output the first depth information with reduced noise by using the visibility information.

In one embodiment, the executable instructions may cause the processor to further perform operations of: generating visibility information on the component by using the pattern of light reflected from the component and received by the image sensor, and further inputting the visibility information into the machine-learning-based model.

According to one embodiment of the present disclosure, a method of inspecting a mounting state of a component by a printed circuit board inspection apparatus may include: controlling a plurality of first light sources to irradiate a component mounted on a printed circuit board with a pattern of light; generating first depth information on the component by using the pattern of light reflected from the component and received by an image sensor; inputting the first depth information into a machine-learning-based model; obtaining the first depth information with reduced noise on the component from the machine-learning-based model; and inspecting the mounting state of the component by using the first depth information with reduced noise on the component, and wherein, when first depth information on the first object generated using a pattern of light reflected from the first object among patterns of light irradiated from a plurality of second light sources is input, the machine-learning-based model outputs the first depth information with reduced noise.

In one embodiment, the machine-learning-based model may be trained to output third depth information with reduced noise by using the third depth information on the second object generated using the pattern of light reflected from a second object among the patterns of light irradiated from the plurality of second light sources and fourth depth information on the second object generated using a pattern of light reflected from the second object among patterns of light irradiated from a plurality of third light sources, and may output the first depth information with reduced noise when the first depth information is input based on a training result.

As described above, the printed circuit board inspection apparatus according to various embodiments of the present disclosure may process the depth information on the component through the machine-learning-based model, thereby reducing noise from the depth information on the component and inspecting the mounting state of the component mounted on the printed circuit board by using the depth information with reduced noise on the component. The printed circuit board inspection apparatus may remove noise such as an unreceived signal or a peak signal from the depth information on the component by using the machine-learning-based model even though a relatively small number of pieces of image data are obtained to generate the depth information, and may generate the depth information on the component so that the lost shape can be restored using the machine-learning-based model even though a relatively small number of pieces of image data are obtained so that information for generating the depth information is insufficient. In addition, the printed circuit board inspection apparatus may not perform error restoration of the joint shape of the component while correcting the three-dimensional (3D) sharpness of the edges of the component as much as possible, and may detect the shape of an additionally measured foreign material without deteriorating the same.

In this manner, by reducing noise in the depth information on the component and by performing shape restoration on the component mounted on the printed circuit board and a solder paste as closely as possible to the shape of the actual component and solder paste, it is possible to inspect the mounting state of the component more accurately.

BRIEF DESCRIPTION OF DRAWINGS

FIG. 3 is a flowchart illustrating a method of inspecting a mounting state of a component by a printed circuit board inspection apparatus according to various embodiments of the present disclosure.

FIGS. 8A to 8C illustrate images of a component generated using depth information with reduced noise by a printed circuit board inspection apparatus according to various embodiments of the present disclosure.

DETAILED DESCRIPTION

Figure 1:
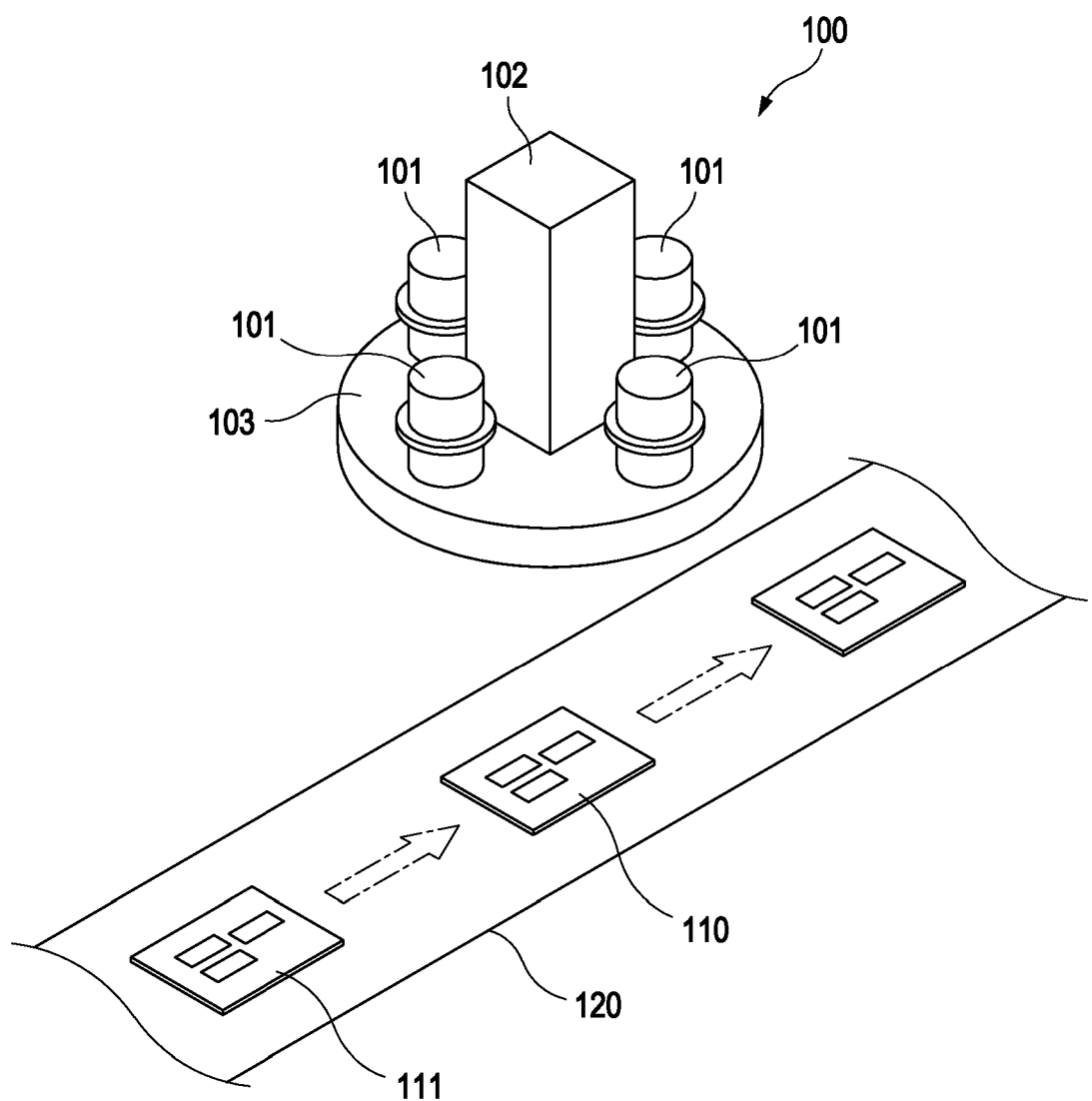
FIG. 1 illustrates a printed circuit board inspection apparatus according to various embodiments of the present disclosure.

Embodiments of the present disclosure are illustrated for describing the technical spirit of the present disclosure. The scope of the claims according to the present disclosure is not limited to the embodiments described below or to the detailed descriptions of these embodiments.

All technical or scientific terms used herein have meanings that are generally understood by a person having ordinary knowledge in the art to which the present disclosure pertains, unless otherwise specified. The terms used herein are selected for only more clear illustration of the present disclosure, and are not intended to limit the scope of claims in accordance with the present disclosure.

The expressions "include", "provided with", "have" and the like used herein should be understood as open-ended terms connoting the possibility of inclusion of other embodiments, unless otherwise mentioned in a phrase or sentence including the expressions.

A singular expression can include meanings of plurality, unless otherwise mentioned, and the same is applied to a singular expression stated in the claims.

The terms "first", "second", etc., used herein are used to identify a plurality of components from one another, and are not intended to limit the order or importance of the relevant components.

The term "unit" used in these embodiments means a software component or hardware component, such as a field-programmable gate array (FPGA) and an application specific integrated circuit (ASIC). However, a "unit" is not limited to software and hardware, it may be configured to be an addressable storage medium or may be configured to run on one or more processors. For example, a "unit" may include components, such as software components, object-oriented software components, class components, and task components, as well as processors, functions, attributes, procedures, subroutines, segments of program codes, drivers, firmware, micro-codes, circuits, data, databases, data structures, tables, arrays, and variables. Functions provided in components and "units" may be combined into a smaller number of components and "units" or further subdivided into additional components and "units."

The expression "based on" used herein is used to describe one or more factors that influence a decision, an action of judgment or an operation described in a phrase or sentence including the relevant expression, and this expression does not exclude additional factor influencing the decision, the action of judgment or the operation.

When a certain component is described as "coupled to" or "connected to" another component, this should be understood as having meaning that the certain component may be coupled or connected directly to the other component or that the certain component may be coupled or connected to the other component via a new intervening component.

Hereinafter, embodiments of the present disclosure will be described with reference to the accompanying drawings. In the accompanying drawings, like or relevant components are indicated by like reference numerals. In the following description of embodiments, repeated descriptions of the identical or relevant components will be omitted. However, even if a description of a component is omitted, such a component is not intended to be excluded in an embodiment.

FIG. 1 illustrates a printed circuit board inspection apparatus according to various embodiments of the present disclosure.

According to various embodiments of the present disclosure, a printed circuit board inspection apparatus 100 may inspect the mounting state of at least one component mounted on a printed circuit board 110. A transport unit 120 may move the printed circuit board 110 to a predetermined position in order to inspect the mounting state of the components. In addition, when the inspection is completed by the printed circuit board inspection apparatus 100, the transport unit 120 may move the printed circuit board 110, which has been inspected, to deviate from the predetermined position, and may move another printed circuit board 111 to a predetermined printed circuit board.

According to various embodiments of the present disclosure, the printed circuit board inspection apparatus 100 may include a first light source 101, an image sensor 102, and a frame 103. The first light source 101 and the image sensor 102 may be fixed to the frame 103. The number and arrangement of each of the first light source 101, the image sensor 102, and the frame 103 shown in FIG. 1 are for the purpose of explanation, but are not limited thereto. For example, one first light source 101 may be arranged in the position of the image sensor 102 shown in FIG. 1, and a plurality of image sensors may be arranged in the position of the first light source 101 shown in FIG. 1. The first light source 101 and the image sensor 102 may be arranged in various directions and angles through the plurality of frames 103.

In one embodiment, the first light source 101 may irradiate, with a pattern of light, the printed circuit board 110 moved to a predetermined position to inspect the mounting state of the component. In the case of a plurality of first light sources 101, they may be arranged to have different irradiation directions, different irradiation angles, and the like. In addition, in the case of a plurality of first light sources 101, pitch intervals of the pattern of light irradiated from the first light sources 101 may be different from each other. For example, the pattern of light may be light having a pattern having a certain period, which is irradiated to measure a three-dimensional (3D) shape of the printed circuit board 110. The first light source 101 may irradiate a pattern of light in which the brightness of the stripes has a sine wave shape, a pattern of light in an on-off form in which bright and dark parts are repeatedly displayed, or a triangular wave-pattern of light having a triangular waveform with a change in brightness. However, this is for illustrative purposes only, and the present disclosure is not limited thereto, and the first light source 101 may irradiate light including various types of patterns in which a change in brightness is repeated at a constant period.

In one embodiment, the image sensor 102 may receive a pattern of light reflected from the printed circuit board 110 and the component mounted on the printed circuit board 110. The image sensor 102 may generate image data using the received pattern of light.

Figure 2:
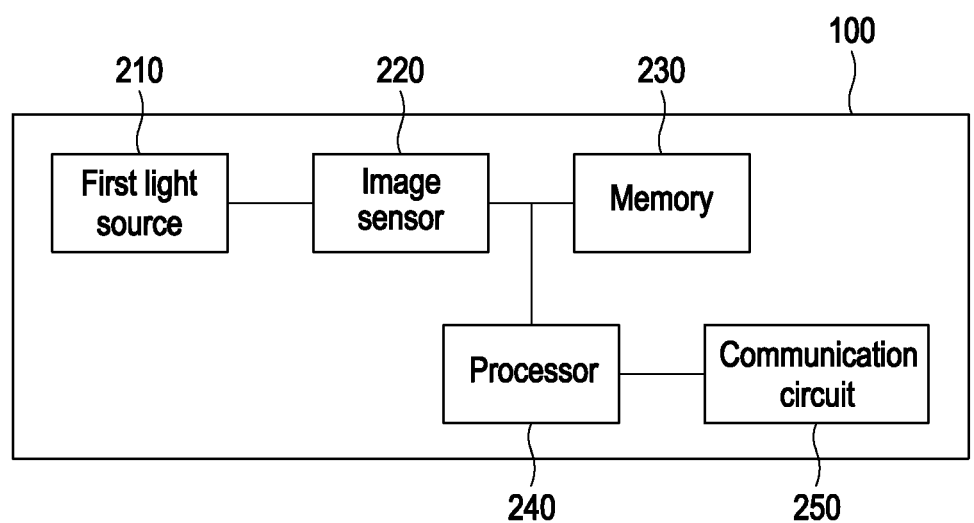
FIG. 2 is a block diagram illustrating a printed circuit board inspection apparatus according to various embodiments of the present disclosure.

FIG. 2 is a block diagram illustrating a printed circuit board inspection apparatus according to various embodiments of the present disclosure.

According to various embodiments of the present disclosure, the printed circuit board inspection apparatus 100 may include a first light source 210, an image sensor 220, a memory 230, and a processor 240. In addition, the printed circuit board inspection apparatus 100 may further include a communication circuit 250. Each component included in the printed circuit board inspection apparatus 100 may be electrically connected to each other to transmit and receive signals and data.

In one embodiment, the printed circuit board inspection apparatus 100 may include a plurality of first light sources 210. The first light source 210 may irradiate an inspection object (e.g., a printed circuit board) with a pattern of light. For example, the first light source 210 may irradiate the entire inspection object with a pattern of light or may irradiate an object (e.g., a component mounted on a printed circuit board) included in the inspection object with a pattern of light. Hereinafter, for convenience of description, although the first light source 210 is mainly described as irradiating the component mounted on the printed circuit board with a pattern of light, the present disclosure is not limited thereto. The first light source 210 may irradiate, with a pattern of light, the entire printed circuit board to be inspected or one region of the printed circuit board including at least one component mounted on the printed circuit board.

In one embodiment, the first light source 210 may include a light source (not shown), a grating (not shown), a grating transport device (not shown), and a projection lens unit (not shown). The grating can convert light irradiated from the light source into a pattern of light. The grating can be transported through a grating transport mechanism, for example a piezo actuator (PZT), to generate phase-shifted pattern of light. The projection lens unit may allow the pattern of light generated by the grating to be irradiated to the component mounted on the printed circuit board, which is an object included in the inspection object. Further, the first light source 210 may form a pattern of light through various methods such as liquid crystal display (LCD), digital light processing (DLP), and liquid crystal on silicon (LCOS), and may allow the formed pattern of light to be irradiated to the component mounted on the printed circuit board which is an object included in the inspection object.

In one embodiment, the image sensor 220 may receive a pattern of light reflected from the component. For example, the image sensor 220 may receive the pattern of light reflected from the component to generate image data on the component. The first image sensor 220 may transmit the generated image data on the component to the processor 240.

In one embodiment, the memory 230 may store instructions or data related to at least one other component of the printed circuit board inspection apparatus 100. Also, the memory 230 may store software and/or programs. For example, the memory 230 may include an internal memory or an external memory. The internal memory may include at least one of volatile memory (e.g., DRAM, SRAM or SDRAM), and non-volatile memory (e.g., flash memory, hard drive, or solid state drive (SSD)). The external memory may be functionally or physically connected to the printed circuit board inspection apparatus 100 through various interfaces.

In one embodiment, the memory 230 may store instructions for operating the processor 240. For example, the memory 230 may store instructions that cause the processor 240 to control other components of the printed circuit board inspection apparatus 100 and to interwork with an external electronic device or a server. The processor 240 may control the other components of the printed circuit board inspection apparatus 100 based on the instructions stored in the memory 230 and may interwork with the external electronic device or the server. Hereinafter, the operation of the printed circuit board inspection apparatus 100 will be described mainly with each component of the printed circuit board inspection apparatus 100. Also, instructions for performing an operation by each component may be stored in the memory 230.

In one embodiment, the memory 230 may store a machine-learning-based model. The machine-learning-based model may receive first depth information on a first object using a pattern of light reflected from the first object among patterns of light irradiated from a plurality of second light sources. For example, the first depth information may include at least one of a shape, color information for each pixel, brightness information, and a height value.

For example, the plurality of second light sources and the plurality of first light sources 210 may be the same or different. Although the plurality of second light sources are different from the plurality of first light sources 210, the number of the plurality of second light sources may be the same as the number of the plurality of first light sources 210. Further, even if the plurality of second light sources are included in another printed circuit board inspection apparatus, the arrangement positions of the plurality of second light sources in the other printed circuit board inspection apparatus may correspond to the arrangement positions of the plurality of first light sources in the printed circuit board inspection apparatus 100. In the machine-learning-based model, when the first depth information is input, first depth information with reduced noise may be output.

For example, the first depth information generated using a pattern of light reflected from the first object may generate noise in multiple reflections of the pattern of light irradiated on the first object or in the process of processing the received light by the image sensor. For example, the noise may be a portion of the first depth information that does not correspond to the shape of the first object or that is determined not to be related to the first object. In order to improve the quality of the image on the first object, for example, the 3D image on the first object, the machine-learning-based model may be trained to output the first depth information with reduced noise. Examples of the machine-learning-based model may include a convolutional neural network (CNN), a generative adversarial network (GAN), and the like. When the first depth information is input to the machine-learning-based model, a detailed method of training the machine-learning-based model to output the first depth information with reduced noise will be described later.

In addition, the machine-learning-based model may be stored in a memory of an external electronic device or server interworking with the printed circuit board inspection apparatus 100 by wire or wirelessly. In this case, the printed circuit board inspection apparatus 100 may transmit and receive information to and from the external electronic device or server interworked by wire or wirelessly to reduce the noise of the first depth information.

In one embodiment, the processor 240 may drive an operating system or an application program to control at least one other component of the printed circuit board inspection apparatus 100, and may perform a variety of data processing, calculation, and the like. For example, the processor 240 may include a central processing unit or the like, or may be implemented as a system on chip (SoC).

In one embodiment, the communication circuit 250 may communicate with an external electronic device or an external server. For example, the communication circuit 250 may establish communication between the printed circuit board inspection apparatus 100 and an external electronic device. The communication circuit 250 may be connected to a network through wireless communication or wired communication to communicate with an external electronic device or external server. As another example, the communication circuit 250 may be connected to an external electronic device in a wired manner to perform communication.

The wireless communication may include, for example, cellular communication (e.g., LTE, LTE advance (LTE-A), code division multiple access (CDMA), wideband CDMA (WCDMA), universal mobile telecommunications system (UMTS), wireless broadband (WiBro), etc.). Further, the wireless communication may include short-range wireless communication (e.g., Wi-Fi, light fidelity (Li-Fi), Bluetooth, Bluetooth low power (BLE), Zigbee, near field communication (NFC), etc.).

In one embodiment, the processor 240 may generate second depth information on the component by using the pattern of light reflected from the component mounted on the printed circuit board received by the image sensor 220. For example, the processor 240 may generate second depth information on the component by using an image of the component generated using the pattern of light reflected from the component generated by the image sensor 220. As another example, the image sensor 220 may transmit the received information on the pattern of light to the processor 240, and the processor 240 may generate an image of the component and may use the image of the component to generate the second depth information on the component. The processor 240 may generate the second depth information on the component by applying an optical triangulation method or a bucket algorithm to the image of the component. However, this is for illustrative purposes only, and the present disclosure is not limited thereto, and the second depth information on the component may be generated through various methods.

In one embodiment, the processor 240 may input the second depth information to the machine-learning-based model. For example, when the machine-learning-based model is stored in the memory 230, the processor 240 may directly input the second depth information to the machine-learning-based model. As another example, when the machine-learning-based model is stored in an external electronic device or an external server, the processor 240 may control the communication circuit 250 to transmit the second depth information to the external electronic device or the external server.

In one embodiment, the processor 240 may obtain the second depth information with reduced noise from the machine-learning based model. For example, when the machine-learning-based model is stored in the memory 230, the processor 240 may input the second depth information with reduced noise directly from the machine-learning-based model. As another example, when the machine-learning based model is stored in the external electronic device or the external server, the processor 240 may obtain the second depth information with reduced noise from the external electronic device or the external server through the communication circuit 250.

In one embodiment, the processor 240 may inspect the mounting state of the component mounted on the printed circuit board by using the second depth information with reduced noise. For example, the processor 240 may generate a 3D image of the component using the second depth information with reduced noise. In addition, the processor 240 may inspect the mounting state of the component using the generated 3D image of the component. For example, the processor 240 may use the 3D image of the component to inspect whether the component is mounted at a predetermined position, whether the component is mounted in a predetermined direction, whether at least a portion of the component is tilted and mounted, whether there is a foreign object in the component, or the like, thereby inspecting the mounting state of the component.

In one embodiment, when visibility information about the first object is further input, the machine-learning-based model may output first depth information with reduced noise using the visibility information. For example, the visibility information is information indicating the degree of noise, and the machine-learning-based model may use the visibility information to effectively reduce the noise in the first depth information. A specific method for training the machine-learning-based model to output the first depth information with reduced noise when the first depth information and the visibility information are input to the machine-learning-based model will be described later.

In one embodiment, the processor 240 may generate visibility information about a component using a pattern of light which is reflected from the component and is received by the image sensor 220. For example, visibility information represents the ratio of the amplitude (Bi(x, y)) of a brightness signal of image data to an average brightness (Ai(x, y)) and tends to generally increase as reflectivity increases. The visibility information (Vi(x, y)) may be represented by Equation 1.

$$V_i(x,y)=B_i(x,y)/A_i(x,y) \qquad \text{[Equation 1]}$$

For example, patterns of light may be emitted respective from the plurality of first light sources 210 to the printed circuit board in various directions, thereby generating a plurality of pieces of image data of a component by the image sensor 220 or the processor 240. The processor 240 may extract N brightness degrees (Ii1, Ii2, . . . , and IiN) at individual positions (i(x, y)) in an X-Y coordinate system from the plurality of pieces of generated image data and may calculate an average brightness (Ai(x, y)) using an amplitude (Bi(x, y)) and an N-bucket algorithm. The processor 240 may generate visibility information (Vi(x,y)) using the calculated amplitude (Bi(x, y)) and average brightness (Ai(x, y)). In addition, the processor 240 may further input the generated visibility information about the component into the machine-learning-based model.

In one embodiment, the machine-learning-based model may receive a plurality of pieces of depth information about a first object generated using a pattern of light reflected from the first object among patterns of light emitted from the plurality of second light sources. Since each of the plurality of second light sources emits a pattern of light to the first object and the pattern of light emitted by each of the plurality of second light sources is reflected from the first object and is received by the image sensor, a plurality of pieces of depth information about the first object may be generated.

When the plurality of pieces of depth information is input, the machine-learning-based model may generate and output first depth information with reduced noise. A specific method for training the machine-learning-based model to generate and output the first depth information with reduced noise when the plurality of pieces of depth information is input to the machine-learning-based model will be described later. For example, the first depth information is representative depth information about the first object and may be generated based on the plurality of pieces of depth information about the first object.

In one embodiment, the processor 240 may generate a plurality of pieces of depth information about a component using a pattern of light which is reflected from the component and is received by the image sensor 220. Since each of the plurality of first light sources emits a pattern of light to the component and the pattern of light emitted by each of the plurality of first light sources is reflected from the component and is received by the image sensor 220, a plurality of pieces of depth information about the component may be generated.

The processor 240 may input the plurality of pieces of depth information about the component into the machine-learning-based model. For example, each of the plurality of first light sources 210 emits a pattern of light to the component mounted on the printed circuit board, and the image sensor 220 may generate a plurality of pieces of image data about the component using the pattern of light reflected from the component. The image sensor 220 may transmit the plurality of pieces of image data to the processor 240. The processor 240 may generate a plurality of pieces of depth information about the component using the plurality of pieces of image data.

In one embodiment, the processor 240 may obtain second depth information with reduced noise from the machine-learning-based model. The second depth information may be generated by the machine-learning-based model based on the plurality of pieces of depth information about the component. For example, the second depth information is representative depth information about the component and may be generated based on the plurality of pieces of depth information about the component.

In one embodiment, the machine-learning-based model may receive a plurality of pieces of image data about a first object generated using a pattern of light reflected from the first object among patterns of light emitted from the plurality of second light sources. When the plurality of pieces of image data is input, the machine-learning-based model may generate and output first depth information with reduced noise. A specific method for training the machine-learning-based model to generate and output the first depth information with reduced noise when the plurality of pieces of image data about the first object is input to the machine-learning-based model will be described later.

In one embodiment, the processor 240 may input a plurality of pieces of image data about a component generated using a pattern of light which is reflected from the component and is received by the image sensor 220 into the machine-learning-based model. In another example, the processor 240 may generate a plurality of pieces of image data about a component using information about a pattern of light which is reflected from the component and is received by the image sensor 220 and may input the plurality of pieces of generated image data into the machine-learning-based model.

In one embodiment, the processor 240 may obtain first depth information with reduced noise from the machine-learning-based model. Second depth information may be generated by the machine-learning-based model based on the plurality of pieces of image data.

FIG. 3 is a flowchart illustrating a method of inspecting a mounting state of a component by a printed circuit board inspection apparatus according to various embodiments of the present disclosure.

Although process steps, method steps, algorithms, and the like have been described in a sequential order in the flowchart shown in FIG. 3, such processes, methods, and algorithms may be configured to be operated in arbitrary appropriate orders. In other words, the steps of the processes, methods, and algorithms described in various embodiments of the present disclosure need not be performed in the order described in this disclosure. Also, although some steps are described as being performed asynchronously, in other embodiments, some of these steps may be performed simultaneously. Also, the illustration of the process by depiction in the drawings does not mean that the illustrated process excludes other changes and modifications thereto, that any of the illustrated processes or steps thereof is essential to one or more of the various embodiments of the present disclosure, or that the illustrated process is preferred.

In operation 310, the printed circuit board inspection apparatus 100 may irradiate a component mounted on a printed circuit board with a pattern of light. For example, the processor of the printed circuit board inspection apparatus 100 may control a plurality of first light sources such that the pattern of light is irradiated to each of a plurality of components mounted on the printed circuit board to be inspected.

In operation 320, the printed circuit board inspection apparatus 100 may receive the pattern of light reflected from the component and may generate second depth information on the component using the pattern of light. For example, the first image sensor may generate an image of the component using the pattern of light reflected from the component, and may transmit the generated image of the component to the processor. The processor may generate the second depth information on the component using the image of the component and received from the first image sensor.

In operation 330, the printed circuit board inspection apparatus 100 may input the second depth information to a machine-learning-based model. For example, when the machine-learning-based model is stored in the memory of the printed circuit board inspection apparatus 100, the processor may directly input the second depth information to the machine-learning-based model. As another example, when the machine-learning-based model is stored in an external electronic device or an external server, the processor may control a communication circuit to transmit the second depth information to the external electronic device or the external server.

In operation 340, the printed circuit board inspection apparatus 100 may obtain the second depth information with reduced noise from the machine-learning based model. For example, when the machine-learning-based model is stored in the memory, the processor may obtain the second depth information with reduced noise directly from the machine-learning-based model. As another example, when the machine-learning-based model is stored in the external electronic device or the external server, the processor may obtain the second depth information with reduced noise from the external electronic device or the external server through the communication circuit.

In operation 350, the printed circuit board inspection apparatus may inspect the mounting state of the component using the second depth information with reduced noise. For example, the processor may generate a 3D image of the component using the second depth information with reduced noise. In addition, the processor may inspect the mounting state of the component using the generated 3D image of the component.

Figure 4A:
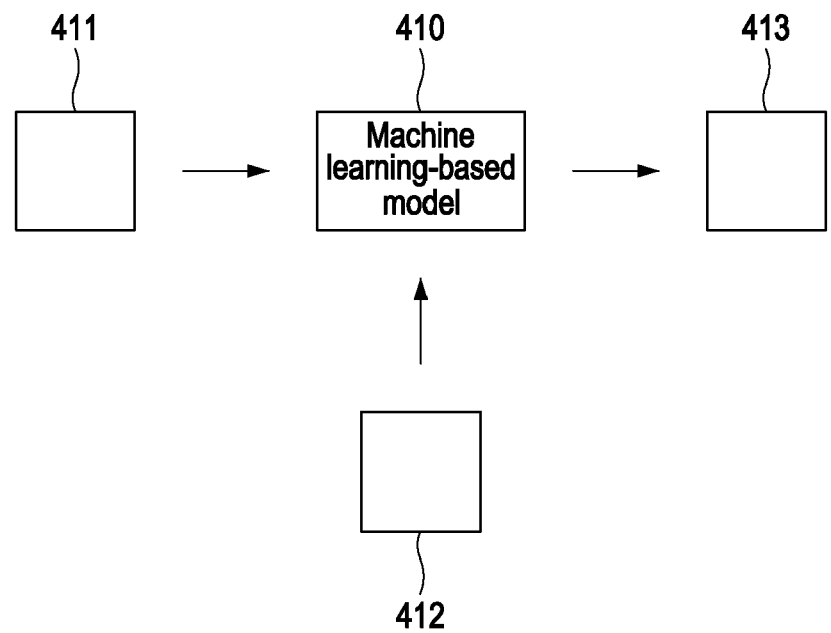
FIGS. 4A to 4C are conceptual diagrams illustrating a learning method of a machine-learning-based model according to various embodiments of the present disclosure.
Figure 4B:
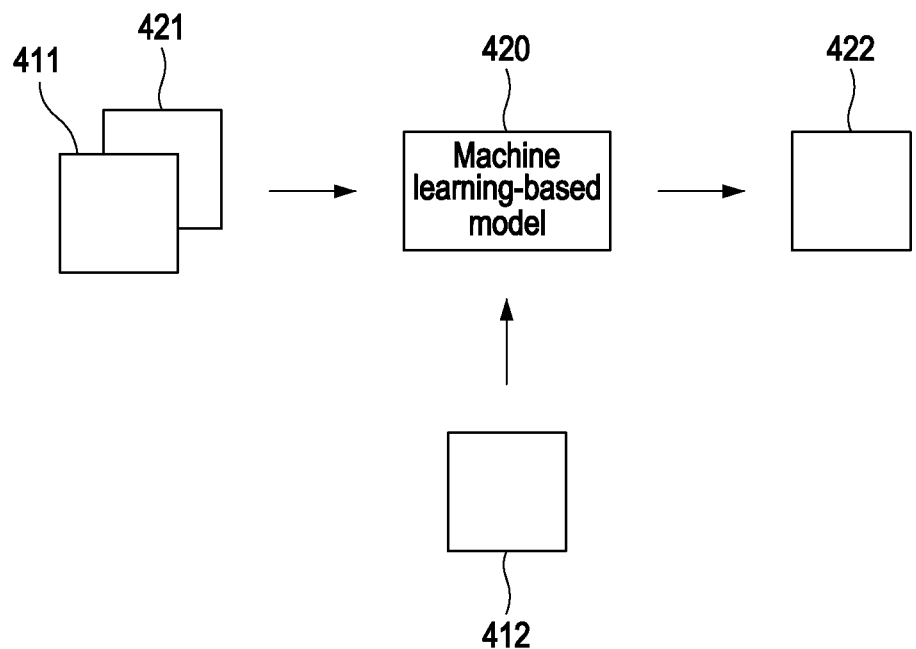
Figure 4C:
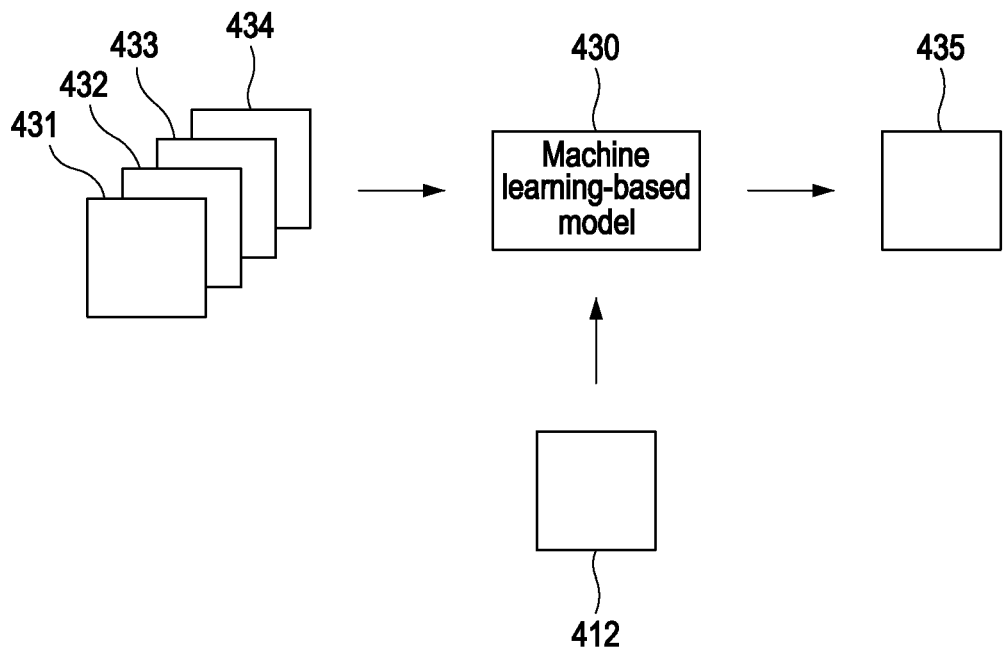

FIGS. 4A to 4C are conceptual diagrams illustrating a learning method of a machine-learning-based model according to various embodiments of the present disclosure.

Referring to FIG. 4A, a machine-learning-based model 410 may be trained to output third depth information with reduced noise 413, using third depth information 411 on a second object generated using a pattern of light reflected from the second object among patterns of light irradiated from a plurality of third light sources and fourth depth information 412 on the second object generated using the pattern of light reflected from the second object among the patterns of light irradiated from a plurality of third light sources.

Based on results learned to output the third depth information with reduced noise 413, the machine-learning-based model 410 may output first depth information with reduced noise even when the first depth information on the first object different from the second object used for learning is input.

In one embodiment, the third depth information 411 and the fourth depth information 412 may be input to the machine-learning-based model 410 for learning. For example, the number of the plurality of third light sources irradiating the pattern of light used to generate the fourth depth information 412 may be larger than the number of a plurality of first light sources and larger than the number of a plurality of second light sources having the same number as the number of the plurality of first light sources. Since the number of the plurality of third light sources is larger than the number of the plurality of second light sources, the number of a plurality of images of the second object used in generating the fourth depth information 412 may be larger than the number of a plurality of images of the second object used in generating the third depth information 411. Since the irradiation direction, irradiation angle, and pitch interval of each of the plurality of fourth light sources are different from each other, all of the plurality of images of the second object used in generating the fourth depth information 412 may be images of the second object, but they may be different images from each other. Similarly, since the irradiation direction, irradiation angle, and pitch interval of each of the plurality of third light sources are different from each other, all of the plurality of images of the second object used in generating the third depth information 411 may be images of the second object, but they may be different images from each other.

In addition, since the number of the plurality of fourth light sources is larger than the number of the plurality of third light sources, the plurality of fourth light sources may irradiate the second object with light while having at least one irradiation direction, at least one irradiation angle, and at least one pitch interval which are different from those of the plurality of third light sources. Accordingly, the number of the plurality of images of the second object used in generating the fourth depth information 412 may be larger than the number of the plurality of images of the second object used in generating the third depth information 411. As a result, the generated fourth depth information 412 may generate relatively less noise than the third depth information 411. Accordingly, the shape of the object measured through depth information generated using a large number of light sources may be closer to the actual shape of the object compared to the shape of the object measured through depth information generated using a small number of light sources.

In one embodiment, since the fourth depth information 412 generates relatively less noise than the third depth information 411, the fourth depth information 412 may be used as depth information that is a reference in a process in which the machine-learning-based model 410 transforms the third depth information 411 to reduce noise from the third depth information 411 or a process in which the machine-learning-based model 410 is trained to output noise from the third depth information 411.

In one embodiment, the machine-learning-based model 410 may be trained to transform the third depth information 411 to converge to the fourth depth information 412. Hereinafter, for convenience of description, the third depth information 411 transformed to converge to the fourth depth information 412 is referred to as transformation depth information. For example, the machine-learning-based model 410 may compare the transformation depth information and the fourth depth information 412. The machine-learning-based model 410 may adjust a parameter for transformation of the third depth information 411 based on the comparison result. By repeating the above process, the machine-learning-based model 410 may determine the parameter for transformation of the third depth information 411 such that the third depth information 411 converges to the fourth depth information 412. Through this, the machine-learning-based model 410 may be trained to transform the third depth information 411 to converge to the fourth depth information 412. The machine-learning-based model 410 may be trained to output the transformation depth information as the third depth information with reduced noise 414. In this manner, the machine-learning-based model 410 may be trained to transform the third depth information 411 to converge to the fourth depth information 412, so that the shape of the object can be measured more accurately even when the number of images of an object available in generating depth information is relatively insufficient.

In one embodiment, the machine-learning-based model 410 may be trained to detect noise from the third depth information 411. For example, the machine-learning-based model 410 may be trained to detect noise from the third depth information 411 and to output the third depth information with reduced noise 414 by reducing the detected noise.

For example, the machine-learning-based model 410 may be trained to detect a first portion which is determined to be noise from the third depth information 411, by comparing the transformation depth information and the third depth information 411. For example, the machine-learning-based model 410 may be trained to detect a portion in which the difference between the transformation depth information and the third depth information 411 is equal to or larger than a predetermined threshold, as a first portion. The machine-learning-based model 410 may be trained to output the third depth information with reduced noise 413 by reducing the noise detected from the third depth information 411.

Referring to FIG. 4B, the machine-learning-based model 420 may be trained to output the third depth information with reduced noise 422, using the third depth information 411, the fourth depth information 412, and visibility information 421 on the second object generated using a pattern of light reflected from the second object among patterns of light irradiated from the plurality of second light sources.

The machine-learning-based model 420 may output the first depth information with reduced noise even if the first depth information on the first object different from the second object used in learning and visibility information on the first object are input, based on results trained to output the third depth information with reduced noise 413.

In one embodiment, the third depth information 411, the fourth depth information 412, and the visibility information 421 may be further input to the machine-learning-based model 420. The machine-learning-based model 420 may be trained to adjust the transformation depth information by using the visibility information 421 to more accurately represent the shape of the second object. For example, the visibility information 421 is information indicating the degree of noise occurring in the third depth information 411, which is depth information about the second object, and may indicate whether the third depth information 411 is a quality measurement value. For example, the machine-learning-based model 420 may be trained to determine whether there is a second portion having a preset threshold or greater in the visibility information 421.

For example, when the second portion exists, the machine-learning-based model 420 may be trained to determine a portion of the transformation depth information corresponding to the second portion and to adjust the part corresponding to the second portion based on the visibility information 421. The machine-learning-based model 420 may be trained to output the adjusted transformation depth information as the third depth information with reduced noise 422.

In another example, when no second portion exists, the machine-learning-based model 420 may be trained to determine not to adjust the transformation depth information and to output the transformation depth information as the third depth information with reduced noise 422.

In one embodiment, in order to more accurately detect noise, the machine-learning-based model 420 may be trained to detect a third portion that is determined to be noise although it is not actually noise from the first part determined to be noise, using the visibility information 421. When the third portion is detected, the machine-learning-based model 420 may be trained to exclude the third portion from the first portion and to determine the first portion from which the third portion is excluded to be the noise from the third depth information 411. Also, when the third portion is not detected, the machine-learning-based model 420 may be trained to output the third depth information with reduced noise 422 by determining the first portion to be the noise in the third depth information 411 and reducing the noise determined in the third depth information 411.

Referring to FIG. 4C, a machine-learning-based model 430 may be trained to generate the third depth information 411 (refer to FIG. 4A) about the second object using a plurality of pieces of depth information 431, 432, 433, and 434 about the second object generated using a pattern of light reflected from the second object among patterns of light emitted from a plurality of second light sources. The machine-learning-based model 430 may be trained to output third depth information with reduced noise 435 using the generated third depth information 411 and fourth depth information 412. A specific method for training the machine-learning-based model 430 to output the third depth information with reduced noise 435 using the third depth information 411 and the fourth depth information 412 is the same as that illustrated FIG. 4A, and thus a description thereof is omitted.

In one embodiment, the plurality of pieces of depth information 431, 432, 433, and 434 about the second object generated using the pattern of light reflected from the second object among the patterns of light emitted from the plurality of second light sources may be input to the machine-learning-based model 430. The machine-learning-based model 430 may be trained to generate the third depth information 411 (refer to FIG. 4A), which is representative depth information about the second object, using the plurality of pieces of depth information 431, 432, 433, and 434.

Further, although not shown, a plurality of pieces of image data about the second object generated using the pattern of light reflected from the second object among the patterns of light emitted from the plurality of second light sources may be input to the machine-learning-based model 430. The machine-learning-based model 430 may be trained to generate the third depth information 411 (refer to FIG. 4A) about the second object using the plurality of pieces of image data about the second object.

In one embodiment, a plurality of pieces of image data about the second object generated using the pattern of light reflected from the second object among the patterns of light emitted from the plurality of second light sources may be input to the machine-learning-based model 430. The machine-learning-based model 430 may be trained to generate the third depth information 411 (refer to FIG. 4A) using the plurality of pieces of image data.

In one embodiment, the fourth depth information 413 generated using a pattern of light irradiated from a plurality of fourth light sources may be generated by the printed circuit board inspection apparatus including the number of plurality of fourth light sources larger than the number of plurality of third light sources. In addition, the fourth depth information 412 may be generated by the printed circuit board inspection apparatus including the number of plurality of third light sources smaller than the number of plurality of fourth light sources. In this case, a detailed method of generating the fourth depth information 412 will be described in FIG. 7.

Figure 5A:
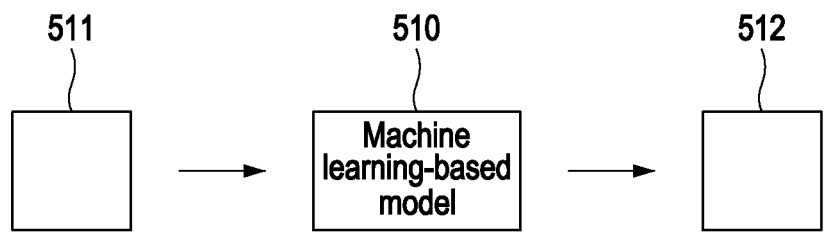
FIGS. 5A to 5C are conceptual diagrams illustrating the operation of a machine-learning-based model according to various embodiments of the present disclosure.
Figure 5B:
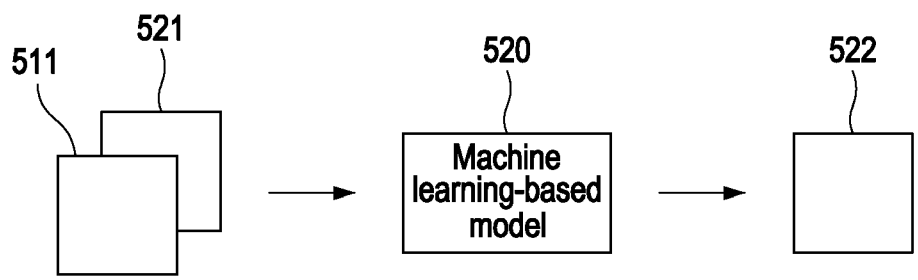
Figure 5C:
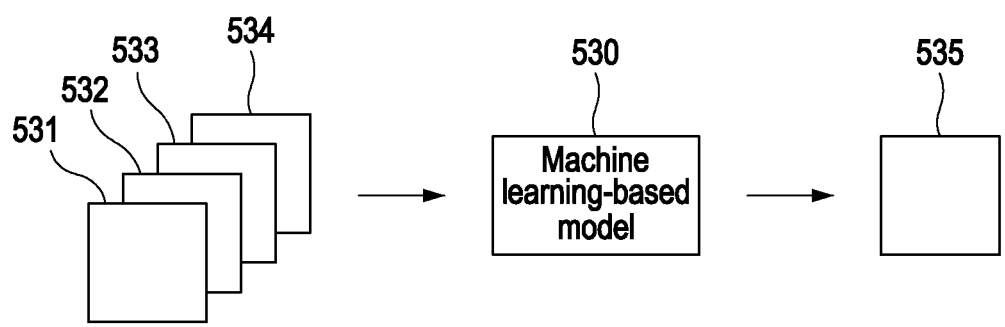

FIGS. 5A to 5C are conceptual diagrams illustrating the operation of a machine-learning-based model according to various embodiments of the present disclosure.

Referring to FIG. 5A, first depth information 511 on a first object generated using a pattern of light reflected from the first object among patterns of light irradiated from a plurality of second light sources may be input to the machine-learning-based model 510. In addition, when the first depth information 511 is input, the machine-learning-based model 510 may output first depth information with reduced noise 512.

Hereinafter, for convenience of description, depth information generated using light irradiated from a plurality of fourth light sources greater than the number of the plurality of third light sources is referred to as reference depth information, and the first depth information 511 transformed to converge to the reference depth information by the machine-learning-based model 510 is referred to as transformation depth information.

In one embodiment, the machine-learning-based model 510 may transform the first depth information 511 to converge to the reference depth information. In this case, the machine-learning-based model 510 may output the transformation depth information as the first depth information with reduced noise 512.

In one embodiment, the machine-learning-based model 510 may detect noise from the first depth information 511. For example, the machine-learning based model 510 may detect noise from the first depth information 511 and may output the first depth information with reduced noise 512 by reducing the detected noise.

For example, the machine-learning-based model 510 may detect a first portion determined to be noise by comparing the transformation depth information and the first depth information 511. For example, the machine-learning-based model 510 may detect a portion in which the difference between the transformation depth information and the first depth information 511 is equal to or larger than a predetermined threshold, as the first portion. The machine-learning-based model 510 may output the first depth information with reduced noise 512 by reducing the noise detected from the first depth information 511.

Referring to FIG. 5B, the first depth information 511 and visibility information 521 about a second object generated using a pattern of light reflected from the second object among the patterns of light emitted from the plurality of second light sources may be input to a machine-learning-based model 520. When the second depth information 511 and the visibility information 521 are input, the machine-learning-based model 520 may output first depth information with reduced noise 513 using the visibility information 521.

In one embodiment, the machine-learning-based model 520 may determine whether there is a second part having a preset threshold or greater in the visibility information 521.

For example, when the second part exists, the machine-learning-based model 520 may determine a part of transformation depth information corresponding to the second part and may adjust the part corresponding to the second part based on the visibility information. The machine-learning-based model 520 may output the adjusted transformation depth information as third depth information with reduced noise 522.

In another example, when no second part exists, the machine-learning-based model 520 may be trained to determine not to adjust the transformation depth information and to output the transformation depth information as the third depth information with reduced noise 522.

In one embodiment, the machine-learning-based model 520 may detect a third portion that is determined to be noise although it is not actually noise from the first portion determined to be noise, by using the visibility information 421. When the third portion is detected, the machine-learning-based model 520 may exclude the third portion from the first portion and may determine the first portion from which the third portion is excluded to be noise in the third depth information 511. In addition, when the third portion is not detected, the machine-learning-based model 520 may determine the first portion to be the noise in the third depth information 511. The machine-learning-based model 520 may output the third depth information with reduced noise 522 by reducing the noise that is determined in the third depth information 511.

Referring to FIG. 5C, a plurality of pieces of depth information 531, 532, 533, and 534 about the first object generated using the pattern of light reflected from the second object among the pattern lights emitted from the plurality of second light sources may be input to a machine-learning-based model 530. The machine-learning-based model 530 may generate the first depth information 511 (refer to FIG. 5A), which is representative depth information about the first object, using the plurality of pieces of depth information 531, 532, 533, and 534. After generating the first depth information 511, the machine-learning-based model 510 may output the first depth information with reduced noise 512 as described in FIG. 5A.

Further, although not shown, a plurality of pieces of image data about the first object generated using the pattern of light reflected from the second object among the patterns of light emitted from the plurality of second light sources may be input to the machine-learning-based model 530. The machine-learning-based model 530 may generate the first depth information 511 (refer to FIG. 5A), which is representative depth information about the first object, using the plurality of pieces of image data. After generating the first depth information 511, the machine-learning-based model 510 may output the first depth information with reduced noise 512 as described in FIG. 5A.

In this manner, even when a relatively small number of pieces of image data are acquired to generate depth information, the printed circuit board inspection apparatus 100 may remove noise, such as an unreceived signal or a peak signal, from the depth information on the component by using machine-learning-based models 510, 520, and 530. Also, the printed circuit board inspection apparatus 100 may generate the depth information on the component so that the lost shape can be restored using the machine-learning-based models 510, 520, and 530 even if a relatively small number of pieces of image data are obtained and thus information for generating the depth information is insufficient. In addition, the printed circuit board inspection apparatus 100 may not perform error restoration of the joint shape of the component while correcting the 3D sharpness of the edges of the component as much as possible, and may detect the shape of an additionally measured foreign material without deteriorating the same.

Figure 6:
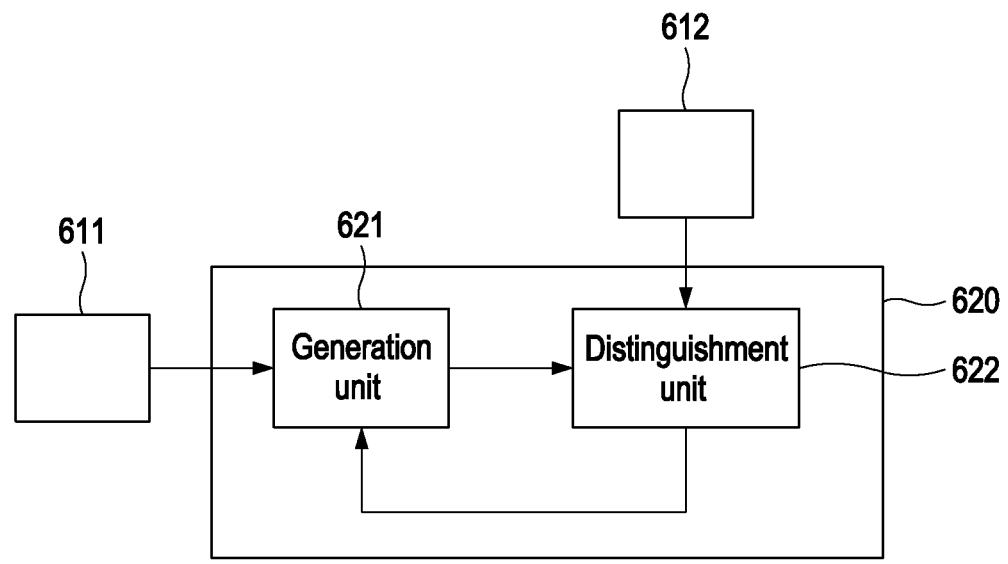
FIG. 6 is a conceptual diagram illustrating a learning method of a machine-learning-based model according to various embodiments of the present disclosure.

FIG. 6 is a conceptual diagram illustrating a learning method of a machine-learning-based model according to various embodiments of the present disclosure.

In one embodiment, a machine-learning-based model 620 may include CNN, GAN, and the like. Hereinafter, a learning method of a machine-learning-based model will be described, focusing on GAN, which can perform image transformation using U-net. The machine-learning-based model 620 may include a generator 621 and a separator 622.

In one embodiment, third depth information 611 on a second object generated using a pattern of light reflected from the second object among patterns of light irradiated from a plurality of third light sources is input to the generator 621. Fourth depth information 612 on the second object generated using the pattern of light reflected from the second object among the patterns of light irradiated from a plurality of fourth light sources may be input to the separator 622.

In one embodiment, the generator 621 may generate transformed third depth information by transforming the third depth information 611 to converge to the fourth depth information 612. The separator 622 may separate the transformed third depth information and the fourth depth information 612 by comparing the transformed third depth information and the fourth depth information 612. The separator 622 may transmit results obtained by separating the transformed third depth information and the fourth depth information 612 to the generator 621. The generator 621 may adjust a parameter for transformation of the third depth information 611 according to the result received from the separator 622. This process is repeated until the separator 622 cannot separate the transformed third depth information and the fourth depth information 612, so that the generator 621 may be trained to generate transformed third depth information by transforming the third depth information 611 to converge to the fourth depth information 612.

Meanwhile, in the generator 621, the third depth information 611 and the fourth depth information 612 on any specific component form a pair. In a case in which any of the third depth information 611 and the fourth depth information 612 has a poor quality (a case in which depth information of any one channel, such as a shadow area, a saturation area, and an SNR, for each of at least one pixel is significantly lower than a predetermined reference value compared to other channels), the generator 621 may additionally perform a refinement operation to exclude the corresponding component data from learning data.

Figure 7:
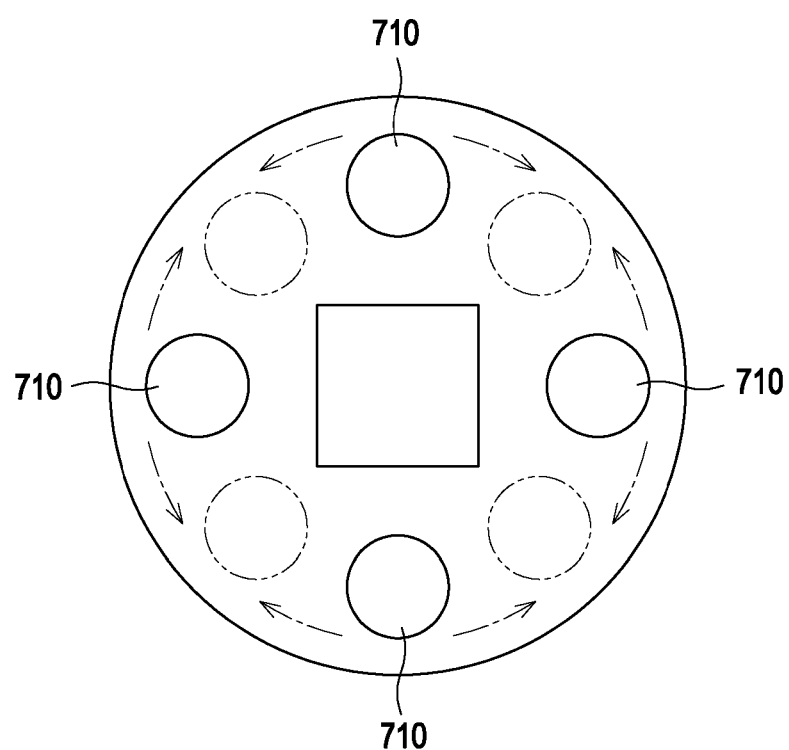
FIG. 7 is a diagram illustrating a method of acquiring depth information used in training a machine-learning-based model according to various embodiments of the present disclosure.

FIG. 7 is a diagram illustrating a method of acquiring depth information used in training a machine-learning-based model according to various embodiments of the present disclosure.

As described in FIGS. 4A to 4C, the fourth depth information 412 may be generated in the printed circuit board inspection apparatus in which the third depth information 411 is generated. For example, as illustrated in FIG. 7, it is assumed that the number of a plurality of third light sources 710 is 4 and the number of a plurality of fourth light sources is 8. In this case, the processor of the printed circuit board inspection apparatus 100 may control the plurality of third light sources 710 to irradiate the component mounted on the printed circuit board with a pattern of light, may generate the third depth information 411 by using the pattern of light reflected from the component, and may then move the plurality of third light sources 710 clockwise or counterclockwise. The processor may control the plurality of third light sources 710 moved clockwise or counterclockwise so as to irradiate the component mounted on the printed circuit board with the pattern of light, and may generate the fourth depth information 412 by using the pattern of light reflected from the component and the third depth information 411. Meanwhile, in FIG. 7, it has been described that the number of the plurality of third light sources 710 is 4, but this is for illustrative purposes only, and is not limited thereto. The number of the third light sources 710 may be one rather than plural. As such, the fourth depth information 412 may be generated in the printed circuit board inspection apparatus including the plurality of third light sources having a smaller number than the number of the plurality of fourth light sources.

Figure 8A:
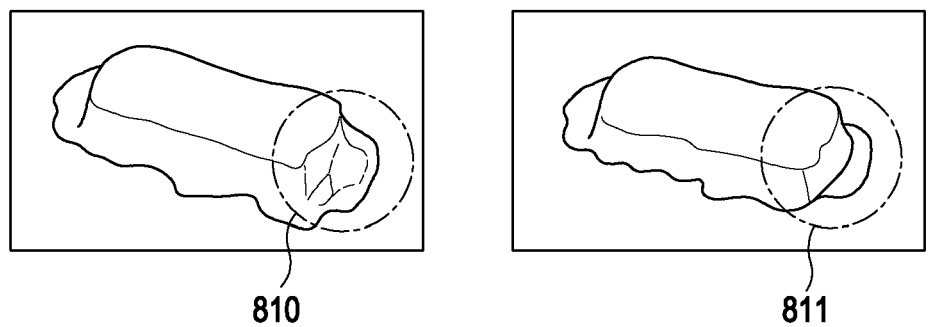

FIGS. 8A to 8C illustrate images of a component generated using depth information with reduced noise by a printed circuit board inspection apparatus according to various embodiments of the present disclosure.

In one embodiment, the printed circuit board inspection apparatus 100 may generate depth information on a component by using a pattern of light reflected from the component among patterns of light irradiated on the component mounted on the printed circuit board, from a plurality of first light sources. In addition, the printed circuit board inspection apparatus 100 may generate a 3D image of the component by using the generated depth information. However, noise may occur in multiple reflections of light irradiated on the printed circuit board or in the process of processing the received light by the image sensor. If the generated noise is not reduced, the quality of the 3D image of the component generated by the printed circuit board inspection apparatus 100 may be deteriorated, and accurate inspection of the mounting state of the component may not be performed.

In one embodiment, the printed circuit board inspection apparatus 100 may reduce noise from the depth information on the component by using a machine-learning-based model, and may generate the 3D image of the component by using the depth information with reduced noise. Since the 3D image generated using the depth information with reduced noise may more accurately display the shape of the component, more accurate inspection of the mounting state of the component can be performed.

Referring to FIG. 8A, when the printed circuit board inspection apparatus 100 generates the 3D image of the component by using the depth information as is without reducing noise, a shape of a connection portion 810 (e.g., solder paste or the like) between the component and the printed circuit board may be displayed as an abnormal shape in the 3D image or displayed as having a hole, due to the noise. On the other hand, when the printed circuit board inspection apparatus 100 reduces noise in the depth information on the component by using the machine-learning-based model and generates the 3D image of the component by using the depth information with reduced noise, a shape of a connection portion 811 (e.g., solder paste or the like) between the component and the printed circuit board may be more accurately displayed in the 3D image.

Referring to FIG. 8B, when the printed circuit board inspection apparatus 100 generates the 3D image of the component by using the depth information as is without reducing noise, a shape of an edge 820 of the component may be displayed as an abnormal shape in the 3D image due to the noise. On the other hand, when the printed circuit board inspection apparatus 100 reduces noise in the depth information on the component by using the machine-learning-based model and generates the 3D image of the component by using the depth information with reduced noise, a shape of the edge 821 of the component may be more accurately displayed in the 3D image.

Referring to FIG. 8C, when the printed circuit board inspection apparatus 100 generates the 3D image of the component by using the generated depth information as is, an internal shape 830 of the component may be displayed as an abnormal shape in the 3D image such as having a hole in the component due to the noise. On the other hand, when the printed circuit board inspection apparatus 100 reduces noise in the depth information on the part by using the machine-learning based model and generates the 3D image of the component by using the depth information with reduced noise, an internal shape 831 of the component may be more accurately displayed in the 3D image.

As described above, the printed circuit board inspection apparatus 100 may display the shape of the component more accurately through the 3D image generated using the depth information with reduced noise, thereby performing more accurate inspection of the mounting state of the component.

While the foregoing methods have been described with respect to particular embodiments, these methods may also be implemented as computer-readable codes on a computer-readable recording medium. The computer-readable recording medium includes any kind of data storage devices that can be read by a computer system. Examples of the computer-readable recording medium includes ROM, RAM, CD-ROM, magnetic tape, floppy disk, optical data storage device and the like. Also, the computer-readable recoding medium can be distributed to the computer systems which are connected through a network so that the computer-readable codes can be stored and executed in a distribution manner. Further, the functional programs, codes and code segments for implementing the foregoing embodiments can easily be inferred by programmers in the art to which the present disclosure pertains.

Although the technical spirit of the present disclosure has been described by the examples described in some embodiments and illustrated in the accompanying drawings, it should be noted that various substitutions, modifications, and changes can be made without departing from the scope of the present disclosure which can be understood by those skilled in the art to which the present disclosure pertains. In addition, it should be noted that that such substitutions, modifications and changes are intended to fall within the scope of the appended claims.

What is claimed is:

1. A printed circuit board inspection apparatus that inspects a mounting state of a component mounted on a printed circuit board, the printed circuit board inspection apparatus comprising:
   a plurality of first light sources configured to irradiate the component with a pattern of light;
   an image sensor configured to receive a pattern of light reflected from the component;
   a memory configured to store a machine-learning-based model, wherein when first depth information on a first object generated using a pattern of light reflected from the first object among patterns of light irradiated from a plurality of second light sources is input into the machine-learning-based model, the machine-learning-based model outputs the first depth information with reduced noise; and
   a processor,
   wherein the processor is configured to:
      generate second depth information on the component by using the pattern of light reflected from the component and received by the image sensor;
      input the second depth information into the machine-learning-based model;
      obtain the second depth information with reduced noise from the machine-learning-based model; and
      inspect the mounting state of the component by using the second depth information with reduced noise,
   wherein the machine-learning-based model is trained to output third depth information with reduced noise by using third depth information on a second object generated using a pattern of light reflected from the second object among the patterns of light irradiated from the plurality of second light sources and fourth depth information on the second object generated using a pattern of light reflected from the second object among patterns of light irradiated from a plurality of third light sources, and
   wherein the machine-learning-based model outputs the first depth information with reduced noise when the first depth information is input based on a training result.

2. The printed circuit board inspection apparatus of claim 1, wherein the number of the plurality of second light sources is the same as the number of the plurality of first light sources, and the number of the plurality of third light sources is larger than the number of the plurality of first light sources.

3. The printed circuit board inspection apparatus of claim 1, wherein the machine-learning-based model comprises a convolutional neural network (CNN) or a generative adversarial network (GAN).

4. The printed circuit board inspection apparatus of claim 1, wherein the processor is configured to generate a three-dimensional image of the component by using the second depth information with reduced noise, and to inspect the mounting state of the component by using the three-dimensional image of the component.

5. The printed circuit board inspection apparatus of claim 1, wherein, when visibility information on the first object is further input into the machine-learning-based model, the machine-learning-based model outputs the first depth information with reduced noise by using the visibility information,
   wherein the visibility information includes a ratio of an amplitude of a brightness signal of image data to an average brightness, and
   wherein the machine-learning-based model is trained to determine whether there is a portion having a preset threshold or greater in the visibility information.

6. The printed circuit board inspection apparatus of claim 5, wherein the machine-learning-based model is trained to output third depth information with reduced noise using third depth information on a second object, which is generated using a pattern of light reflected from the second object among the patterns of light emitted from the plurality of second light sources, visibility information on the second object, which is generated using the pattern of light reflected from the second object among the patterns of light emitted from the plurality of second light sources, and fourth depth information on the second object, which is generated using a pattern of light reflected from the second object among patterns of light emitted from a plurality of third light sources, and to output the first depth information with reduced noise based on a training result when the first depth information and visibility information on the component are input.

7. The printed circuit board inspection apparatus of claim 5, wherein the processor generates visibility information on the component using the pattern of light which is reflected from the component and received by the image sensor, and further inputs the visibility information on the component into the machine-learning-based model.

8. A printed circuit board inspection apparatus for inspecting a mounting state of a component mounted on a printed circuit board, the printed circuit board inspection apparatus comprising:
 a plurality of first light sources to emit a pattern of light to a component;
 an image sensor to receive the pattern of light reflected from the component;
 a memory to store a machine-learning-based model, wherein when a plurality of pieces of depth information on a first object, which is generated using a pattern of light reflected from the first object among patterns of light emitted from a plurality of second light sources, is input into the machine-learning-based model, the machine-learning-based model generates first depth information and outputs the first depth information with reduced noise; and
 a processor,
 wherein the processor is configured to:
 generate a plurality of pieces of depth information on the component using the pattern of light which is reflected from the component and received by the image sensor;
 input the plurality of pieces of depth information on the component into the machine-learning-based model;
 obtain the second depth information with reduced noise from the machine-learning-based model, in which second depth information is generated by the machine-learning-based model based on the plurality of pieces of depth information on the component; and
 inspect a mounting state of the component using the second depth information with reduced noise,
 wherein the machine-learning-based model is trained to:
  generate third depth information on a second object using a plurality of pieces of depth information on the second object generated using a pattern of light reflected from the second object among the patterns of light emitted from the plurality of second light sources; and
  output the third depth information with noise-reduced using the third depth information and fourth depth information on the second object, which is generated using a pattern of light reflected from the second object among patterns of light emitted from a plurality of third light sources, and
 wherein the machine-learning-based model generates the first depth information and outputs the first depth information with reduced noise based on a training result when the plurality of pieces of depth information on the first object is input.

9. The printed circuit board inspection apparatus of claim 8, wherein the number of the plurality of second light sources is the same as the number of the plurality of first light sources, and the number of the plurality of third light sources is larger than the number of the plurality of first light sources.

10. A non-transitory computer-readable recording medium that records a program to be performed on a computer,
 wherein the program comprises executable instructions that cause, when executed by a processor, the processor to perform operations of:
  controlling a plurality of first light sources to irradiate a component mounted on a printed circuit board with a pattern of light;
  generating first depth information on the component by using the pattern of light reflected from the component and received by an image sensor;
  inputting the first depth information into a machine-learning-based model;
  obtaining first depth information with reduced noise from the machine-learning-based model; and
  inspecting the mounting state of the component by using the first depth information with reduced noise, and
 wherein, when first depth information on a first object generated using a pattern of light reflected from the first object among patterns of light irradiated from a plurality of second light sources is input, the machine-learning-based model outputs the first depth information with reduced noise,
 wherein the machine-learning-based model is trained to output third depth information with reduced noise by using third depth information on a second object generated using the pattern of light reflected from the second object among the patterns of light irradiated from the plurality of second light sources and fourth depth information on the second object generated using a pattern of light reflected from the second object among patterns of light irradiated from a plurality of third light sources, and
 wherein the machine-learning-based model outputs the first depth information with reduced noise when the first depth information is input based on a training result.

11. The non-transitory computer-readable recording medium of claim 10, wherein the number of the plurality of second light sources is the same as the number of the plurality of first light sources, and the number of the plurality of third light sources is larger than the number of the plurality of first light sources.

12. The non-transitory computer-readable recording medium of claim 10, wherein the machine-learning-based model comprises a Convolutional Neutral Network (CNN) or a Generative Adversarial Network (GAN).

13. The non-transitory computer-readable recording medium of claim 10, wherein the executable instructions cause the processor to further perform operations of:
 generating a three-dimensional image of the component by using second depth information with reduced noise; and
 inspecting the mounting state of the component by using the three-dimensional image of the component.

14. The non-transitory computer-readable recording medium of claim 10, wherein the machine-learning-based model outputs the first depth information with reduced noise using visibility information on the first object when the visibility information is further input,
 wherein the visibility information includes a ratio of an amplitude of a brightness signal of image data to an average brightness, and
 wherein the machine-learning-based model is trained to determine whether there is a portion having a preset threshold or greater in the visibility information.

15. The non-transitory computer-readable recording medium of claim 14, wherein the executable instructions cause the processor to further perform operations of:
  generating visibility information on the component using the pattern of light which is reflected from the component and received by the image sensor, and
  further inputting the visibility information on the component into the machine-learning-based model.

16. A method of inspecting a mounting state of a component by a printed circuit board inspection apparatus, the method comprising:
  controlling a plurality of first light sources to irradiate a component mounted on a printed circuit board with a pattern of light;
  generating first depth information on the component by using the pattern of light reflected from the component and received by an image sensor;
  inputting the first depth information into a machine-learning-based model;
  obtaining the first depth information with reduced noise on the component from the machine-learning-based model; and
  inspecting the mounting state of the component by using the first depth information with reduced noise on the component,
  wherein, when first depth information on a first object generated using a pattern of light reflected from the first object among patterns of light irradiated from a plurality of second light sources is input, the machine-learning-based model outputs the first depth information with reduced noise,
  wherein the machine-learning-based model is trained to output third depth information with reduced noise by using third depth information on a second object generated using the pattern of light reflected from the second object among the patterns of light irradiated from the plurality of second light sources and fourth depth information on the second object generated using a pattern of light reflected from the second object among patterns of light irradiated from a plurality of third light sources, and
  wherein the machine-learning-based model outputs the first depth information with reduced noise when the first depth information is input based on a training result.

* * * * *